US009159405B2

(12) United States Patent
Lee

(10) Patent No.: US 9,159,405 B2
(45) Date of Patent: Oct. 13, 2015

(54) METHOD AND APPARATUS FOR SURFACE MOUNTING A NON-VOLATILE MEMORY DEVICE

(71) Applicant: Samsung Electronics Co., Ltd, Gyeonggi-do (KR)

(72) Inventor: Jun-Woo Lee, Gyeonggi-do (KR)

(73) Assignee: SAMSUNG ELECTRONICS CO., LTD., Suwon-Si (KR)

( * ) Notice: Subject to any disclaimer, the term of this patent is extended or adjusted under 35 U.S.C. 154(b) by 177 days.

(21) Appl. No.: 13/895,127

(22) Filed: May 15, 2013

(65) Prior Publication Data

US 2013/0308390 A1    Nov. 21, 2013

(30) Foreign Application Priority Data

May 15, 2012    (KR) .................. 10-2012-0051386

(51) Int. Cl.
*G11C 11/56*    (2006.01)
*G11C 16/34*    (2006.01)
*G11C 16/10*    (2006.01)

(52) U.S. Cl.
CPC ........ *G11C 11/5621* (2013.01); *G11C 11/5628* (2013.01); *G11C 16/10* (2013.01); *G11C 16/3481* (2013.01)

(58) Field of Classification Search
CPC ... G11C 16/3418; G11C 7/04; G11C 13/0064
USPC ............. 365/185.22, 185.11, 185.03, 185.24, 365/201, 211
See application file for complete search history.

(56) References Cited

U.S. PATENT DOCUMENTS

| 2008/0117697 | A1* | 5/2008 | Philipp et al. ................. 365/201 |
| 2009/0296466 | A1 | 12/2009 | Kim et al. |
| 2010/0074014 | A1 | 3/2010 | Dunga et al. |
| 2011/0062563 | A1 | 3/2011 | Yang et al. |
| 2011/0075482 | A1* | 3/2011 | Shepard et al. .......... 365/185.11 |
| 2011/0199823 | A1* | 8/2011 | Bar-Or et al. ............ 365/185.03 |

FOREIGN PATENT DOCUMENTS

KR    20110056423 A    5/2011

OTHER PUBLICATIONS

European Search Report dated Oct. 2, 2013 in connection with European Patent Application No. EP 13 16 7715.

* cited by examiner

*Primary Examiner* — J. H. Hur
*Assistant Examiner* — Ajay Ojha

(57) ABSTRACT

A method and an apparatus for programming data, and a method and an apparatus for setting a data programming mode used for the same are provided. The method for programming data in a non-volatile memory device includes determining a programming mode to be used for data programming among at least two programming modes prescribing different verify voltages for cells to be programmed, based on set mode information, and programming data according to the determined programming mode. Consequently, the loss of programmed data is prevented through an SMD reflow process.

16 Claims, 6 Drawing Sheets

METHOD AND APPARATUS FOR SURFACE MOUNTING A NON-VOLATILE MEMORY DEVICE

CROSS-REFERENCE TO RELATED APPLICATION(S) AND CLAIM OF PRIORITY

The present application is related to and claims the priority under 35 U.S.C. §119(a) to Korean Patent Application Serial No. 10-2012-0051386, which was filed in the Korean Intellectual Property Office on May 15, 2012, the entire content of which is hereby incorporated by reference.

TECHNICAL FIELD

The present disclosure relates to a method and an apparatus for programming data, and a method and an apparatus for setting a data programming mode used for the same.

BACKGROUND

Recently, non-volatile memory devices are used to store data, in electronic devices such as a mobile phone, a camera and a tablet. The term "non-volatile memory device" refers to a memory device which maintains data recorded in a cell of the memory device even when power is not supplied to it.

When data is stored in the non-volatile memory device, in other words, when data is programmed, the non-volatile memory device applies a high voltage between a control gate and a substrate, and traps electrons in a floating gate, thereby differentiating a program cell to differ from an erase cell. The term "program cell" refers to a cell in which electrons are trapped in a floating gate. In contrast, the term "erase cell" refers to a cell in which electrons are not trapped in a floating gate.

SUMMARY

The present disclosure provides a method which can prevent the occurrence of data loss in a memory device.

Also, another aspect of the present disclosure is to provide a method, by which data can be stored in a memory device in view of an environment of an SMD reflow process.

Further, other objects that the present disclosure intends to provide can be grasped in the following exemplary embodiments.

In order to achieve the above objects, in accordance with an aspect of the present disclosure, a method for programming data in a non-volatile memory device is provided. The method includes determining a programming mode which is to be used for current data programming among at least two programming modes prescribing different verify voltages for cells into which data is to be programmed, based on set mode information, and programming data according to the determined programming mode.

Meanwhile, in accordance with another aspect of the present disclosure, a method for setting a data programming mode for a non-volatile memory device is provided. The method includes setting at least two programming modes prescribing different verify voltages for cells into which data is to be programmed, and storing mode information on each of the at least two set programming modes in the non-volatile memory device.

Meanwhile, in accordance with another aspect of the present disclosure, an apparatus for programming data in a non-volatile memory device is provided. The apparatus includes a controller for determining a programming mode which is to be used for current data programming among at least two programming modes prescribing different verify voltages for cells into which data is to be programmed, based on set mode information, and generating a control signal according to the determined programming mode, and a voltage generator for applying a programming voltage to at least one cell based on the control signal received from the controller.

Meanwhile, in accordance with another aspect of the present disclosure, an apparatus for setting a data programming mode for a non-volatile memory device is provided. The apparatus includes a mode setter for setting at least two programming modes prescribing different verify voltages for cells into which data is to be programmed, and storing mode information on each of the at least two set programming modes in the non-volatile memory device.

Meanwhile, in accordance with another aspect of the present disclosure, a method for setting a data programming mode for a non-volatile memory device is provided. The method includes setting a default mode to a second programming mode in the non-volatile memory device storing information on a first programming mode prescribing different verify voltages for cells, into which data is to be programmed, and the second programming mode prescribing a verify voltage higher by a set value than a verify voltage prescribed by the first programming mode, and transmitting data, which is input, to the non-volatile memory device.

Meanwhile, in accordance with another aspect of the present disclosure, an apparatus for setting a data programming mode for a non-volatile memory device is provided. The apparatus includes a mode setter for setting a default mode to a second programming mode in the non-volatile memory device storing information on a first programming mode prescribing different verify voltages for cells, into which data is to be programmed, and the second programming mode prescribing a verify voltage higher by a set value than a verify voltage prescribed by the first programming mode, and a data input unit for transmitting data, which is input, to the non-volatile memory device.

Before undertaking the DETAILED DESCRIPTION below, it may be advantageous to set forth definitions of certain words and phrases used throughout this patent document: the terms "include" and "comprise," as well as derivatives thereof, mean inclusion without limitation; the term "or," is inclusive, meaning and/or; the phrases "associated with" and "associated therewith," as well as derivatives thereof, may mean to include, be included within, interconnect with, contain, be contained within, connect to or with, couple to or with, be communicable with, cooperate with, interleave, juxtapose, be proximate to, be bound to or with, have, have a property of, or the like; and the term "controller" means any device, system or part thereof that controls at least one operation, such a device may be implemented in hardware, firmware or software, or some combination of at least two of the same. It should be noted that the functionality associated with any particular controller may be centralized or distributed, whether locally or remotely. Definitions for certain words and phrases are provided throughout this patent document, those of ordinary skill in the art should understand that in many, if not most instances, such definitions apply to prior, as well as future uses of such defined words and phrases.

BRIEF DESCRIPTION OF THE DRAWINGS

For a more complete understanding of the present disclosure and its advantages, reference is now made to the following description taken in conjunction with the accompanying drawings, in which like reference numerals represent like parts.

DETAILED DESCRIPTION

FIGS. 1 through 10, discussed below, and the various embodiments used to describe the principles of the present disclosure in this patent document are by way of illustration only and should not be construed in any way to limit the scope of the disclosure. Those skilled in the art will understand that the principles of the present disclosure may be implemented in any suitably arranged memory devices. Hereinafter, in describing the present disclosure, a detailed description of publicly-known functions or configurations related to the present disclosure will be omitted when it is determined that the detailed description thereof may unnecessarily obscure the subject matter of the present disclosure.

Figure 1:
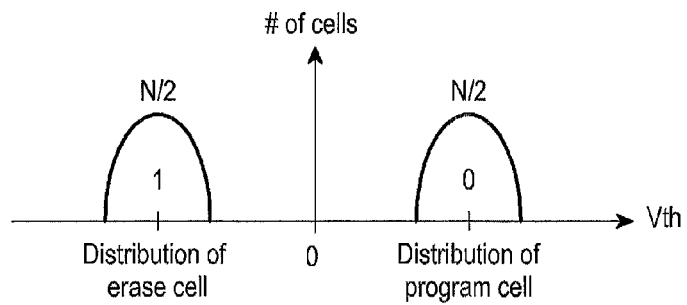
FIG. 1 illustrates an exemplary distribution of threshold voltages in a memory device.

Due to a difference in characteristics between cells, threshold voltages of the cells are not identical, and thus the threshold voltages of the cells have a distribution as shown in FIG. 1.

Meanwhile, an electronic device manufacturer that manufactures electronic devices by using memory devices previously stores an operating system, basic applications and data of a relevant electronic device in a memory device and then mounts the memory device on a PCB (Printed Circuit Board), before the relevant electronic device is released in order to increase process efficiency.

While components such as the memory device are mounted on the PCB, the PCB and the memory device are exposed to a high temperature for a predetermined time period. This process is called a "Surface Mount Device (SMD) reflow process". The memory device is subjected to stress caused by the high temperature during the SMD reflow process. As a result, while there occurs charge loss such that electrons trapped in a floating gate of each cell storing data are lost, some data may be corrupted.

Figure 2:
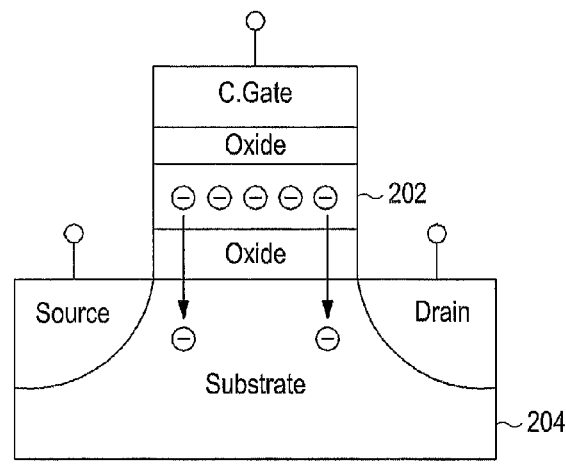
FIG. 2 illustrates an exemplary shift in the distribution of threshold voltages after an SMD reflow process is performed.
Figure 2:
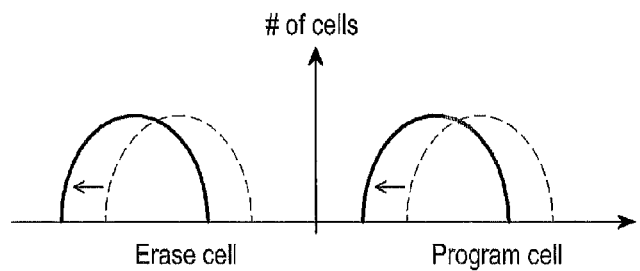

In other words, when the memory device is exposed to the high temperature, electrons trapped in a floating gate 202 move to a substrate 204. Accordingly, the distribution moves in a negative direction. This process is illustrated in FIG. 2.

Meanwhile, as a process for manufacturing memory devices becomes sophisticated and an MLC (Multi-Level Cell) technology for storing one or more bits of data in one cell is applied to the memory devices, a distance between distributions becomes shorter, and accordingly, the amount of data loss caused by the SMD reflow process becomes even larger. Accordingly, a technology for recovering data after the data loss becomes an important issue.

Examples of a method for recovering data after the data loss include a method using an ECC (Error Correction Code) and a method for adjusting a voltage level (or a read level) required to read data.

In the method using an ECC, an ECC parity is stored together with data in a set area of a memory device when the data is stored in the memory device, and the lost data is recovered by using the relevant parity when the data is subsequently read. The method using an ECC has a disadvantage in that the amount of parities required to be stored must be large when the characteristics of cells are poor. Also, it has a problem in that the amount of errors more than that of data capable of being recovered by using the ECC is generated in a particular environment such as the SMD reflow process.

Figure 3:
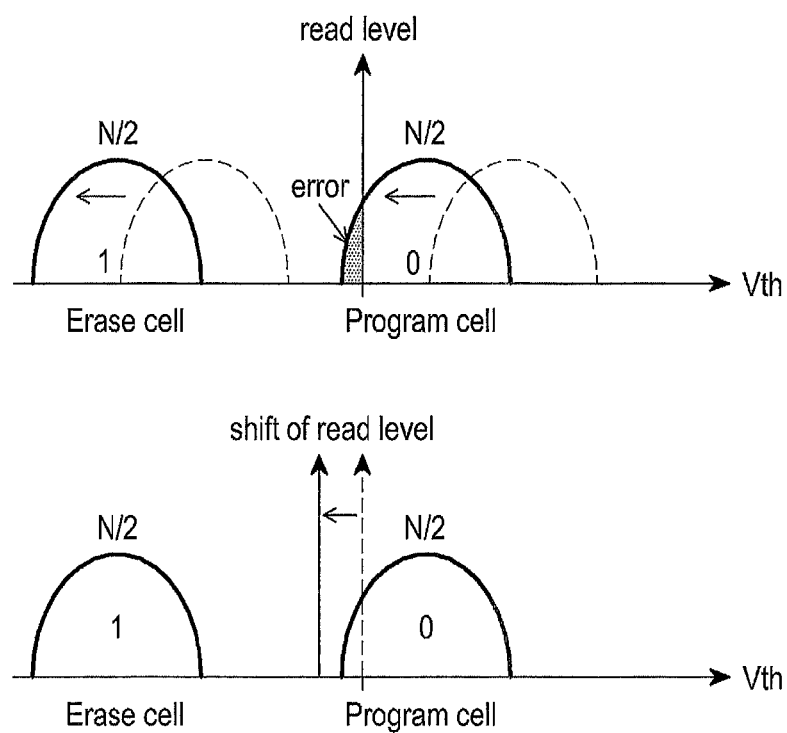
FIG. 3 illustrates an exemplary method for adjusting a data read voltage level.

Meanwhile, as shown in FIG. 3, the method for adjusting a read voltage level (or a read level) required to read data corresponds to a method for moving a read voltage level required to read data by a predetermined value and reading the data. This method has a problem in that a read voltage level must be adjusted whenever data is read and thus a read time period (or read time) becomes longer. Also, in order to avoid the occurrence of an error during the next read time period, a relevant page needs to be stored again in another area. Because data loss occurs in the overall area of the memory device during the SMD reflow process, this method cannot be a method for efficiently recovering data.

As described above, when data is first stored in the memory device and then the SMD reflow process is performed, a problem arises in that data is lost due to the charge loss phenomenon such that electrons trapped in the floating gate of each cell are lost. Also, recovering lost data after the data loss cannot be efficient methods.

Accordingly, the present disclosure proposes a method for storing data in such a manner as to distinguish between data programming modes performed before and after an SMD reflow process.

More specifically, the present disclosure proposes a method capable of measuring the amount of shift in distribution which is to occur due to the SMD reflow process, namely, the amount of a change in a threshold voltage of each cell, and programming data by using a value obtained by compensating for the measured amount of the change in the threshold voltage during data programming which is to be performed before the SMD reflow process.

Also, the present disclosure proposes a method capable of programming data by using an original threshold voltage during data programming which is to be performed after the SMD reflow process.

The present disclosure as described above has an advantage in that data loss can be prevented in spite of a change in a threshold voltage which occurs during an SMD reflow process performed after data is programmed.

Exemplary embodiments of the present disclosure can be applied to various non-volatile memory devices, such as a NOR flash memory using NOR gates and a NAND flash memory using NAND gates.

Also, exemplary embodiments of the present disclosure can be applied to both an SLC (Single Level Cell) which stores one bit of data in one cell and an MLC (Multi-Level Cell) which stores two or more bits of data in one cell.

In describing exemplary embodiments of the present disclosure, it is assumed that a memory device includes cells having a floating gate which traps electrons.

Hereinafter, exemplary embodiments of the present disclosure will be described in detail with reference to the accompanying drawings.

Figure 4:
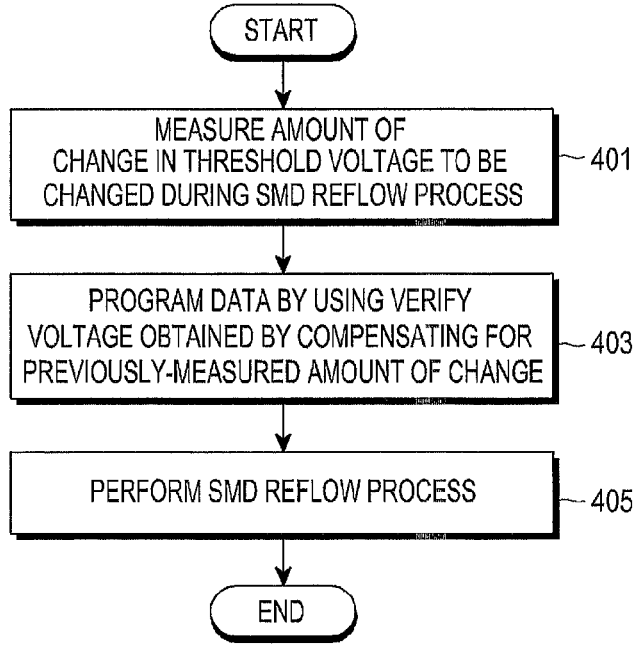
FIG. 4 is a flowchart for explaining the whole concept of a method for programming data according to exemplary embodiments of the present disclosure.

First, the whole concept of a method for programming data according to an exemplary embodiment of the present disclosure will be described with reference to FIG. 4.

In step 401, a memory device manufacturer measures the amount of shift in distribution which is to occur during an SMD reflow process which is to be performed by an electronic device manufacturer, namely, the amount of a change in a threshold voltage of each cell. According to an exemplary embodiment, the amount of a change can be measured by an electronic device manufacturer (hereinafter, referred to as a "host") that manufactures electronic devices by using memory devices, and can provide the measured amount of the change to the memory device manufacturer. Also, the host compensates for the measured amount of the change in the threshold voltage, and stores a verify voltage obtained by compensating for the amount of the change in a memory device so as to enable data programming.

In step 403, the host programs data in such a manner as to store the data, such as an OS (Operating System) and applications, in the memory device. At this time, the host programs the data by using the verify voltage obtained by compensating for the amount of the change in the threshold voltage which is to be changed during the SMD reflow process.

In step 405, the host performs an SMD reflow process. A threshold voltage of each cell of the memory device is shifted during the SMD reflow process. However, the data has been programmed by using the verify voltage obtained by previously compensating for the amount of the change in the threshold voltage which has been measured in step 401. Accordingly, each cell of the memory device has a threshold voltage appropriate for reading data.

According to the present disclosure as described above, the data is programmed by using the verify voltage that is obtained by previously compensating for the amount of the change in the threshold voltage which is to occur during the SMD reflow process. As a result, the present disclosure has an advantage in that data loss does not occur even when the memory device subsequently goes through an SMD reflow process.

Hereinabove, the concept of the method for programming data according to an exemplary embodiment of the present disclosure has been described with reference to FIG. 4. Hereinafter, exemplary embodiments of the present disclosure will be described in more detail with reference to the related drawings.

Figure 5:
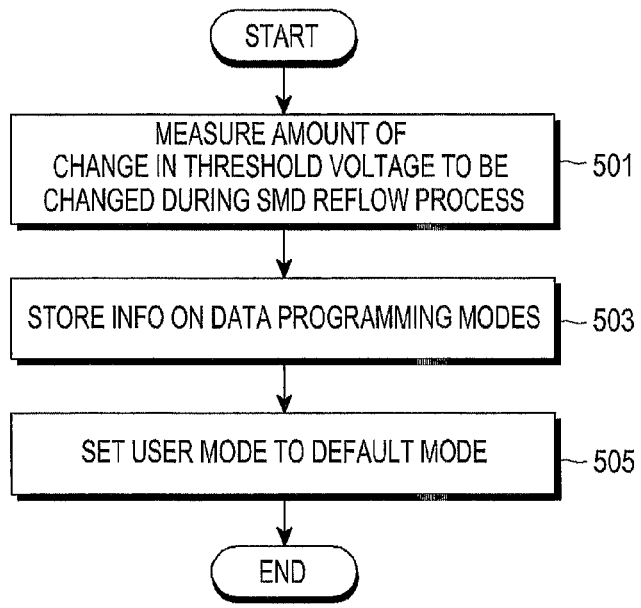
FIG. 5 is a flowchart for explaining a method for setting a data programming mode according to an embodiment of the present disclosure.

FIG. 5 is a flowchart for explaining a process for setting a data programming mode by a memory device manufacturer according to an embodiment of the present disclosure.

In step 501, a memory device manufacturer measures a shift in distribution which is to occur during an SMD reflow process. In other words, the memory device manufacturer measures the amount of a change in a threshold voltage of each cell during the SMD reflow process. In order to measure the amount of the change, the memory device manufacturer can receive time and temperature conditions during the SMD reflow process, which are provided by the host. In this case, the memory device manufacturer can measure the amount of a change in a threshold voltage which is to be changed during the SMD reflow process based on the time and temperature conditions during the SMD reflow process, which have been received from the host. That is, the memory device manufacturer places a memory device in which data is programmed, under the time and temperature conditions which have been received from the host, and then can measure the amount of shift in a threshold voltage of each cell in which data is programmed.

According to an exemplary embodiment, the memory device manufacturer can receive the amount of shift provided by the host. Here, the time and temperature conditions include at least one time period, during which a predetermined temperature is maintained. According to an exemplary embodiment, the time and temperature conditions include at least one time period, during which a temperature constantly increases or decreases at a predetermined slope.

In step 503, the memory device manufacturer stores information on two data programming modes used to program data, in the memory device.

One of the programming modes corresponds to a mode (hereinafter, referred to as a "user mode") used when data is programmed by a user who uses an electronic device including the memory device. The other one corresponds to a mode (hereinafter, referred to as an "SMD mode") used when the host programs data such as an operating system and applications before the SMD reflow process is performed.

Here, an SMD mode prescribes a verify voltage different from that of a user mode. That is, the SMD mode prescribes a verify voltage higher by the amount of the change which has been measured in step 501. The prescription of a higher verify voltage is to prevent data loss caused by the drop of a threshold voltage which occurs when the host performs an SMD reflow process.

The information on the programming modes include information on which mode is a relevant programming mode, information on whether the relevant programming mode is a default mode, and a verify voltage which is to be used when data is programmed in the relevant mode. For example, in regard to a threshold voltage, when the memory device is an SLC memory device, it can store a verify voltage matched to data "0." When the memory device is an MLC memory device, it can store a verify voltage matched to each state. For example, when the memory device is an MLC memory device capable of storing 2-bit information, it can store a verify voltage matched to data "10," a verify voltage matched to data "01," and a verify voltage matched to data "00." Such a verify voltage is stored in response to the relevant data programming mode. For example, a verify voltage which is to be used when data is programmed in the user mode, is stored in response to information indicating the user mode. Similarly, a verify voltage which is to be used when data is programmed in the SMD mode is stored in response to information indicating the SMD mode.

For example, when a threshold voltage matched to a state "0" is equal to 1 V in an SLC memory device, a verify voltage matched to a state "0" is prescribed as $(1+\alpha)$ V in the SMD mode. Here, a compensation value $\alpha$ represents a value for compensating for the amount of a change in a threshold voltage which is to be changed while an SMD reflow process is performed. The compensation value $\alpha$ can be calculated by measuring the amount of the change in the threshold voltage depending on the time and temperature conditions which are set. The calculation of the compensation value α will be described below with reference to FIGS. 6A and 6B.

Figure 6A:
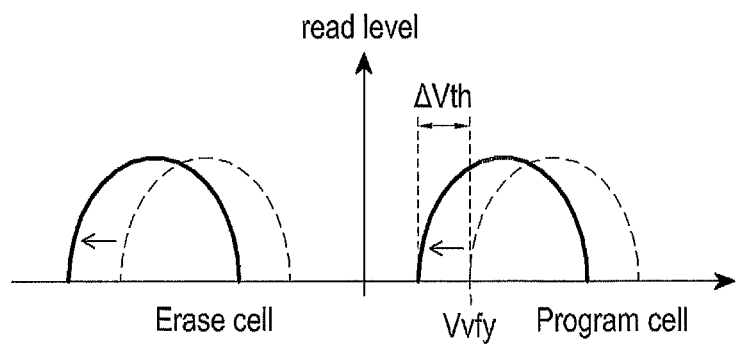
FIGS. 6A and 6B illustrate the shifts of distribution of threshold voltages according to embodiments of the present disclosure.

First, FIG. 6A shows a shift in a threshold voltage when data is first programmed by using a user mode and then an SMD reflow process is performed. That is, when data is first programmed by using a verify voltage Vvfy in the user mode and then the SMD reflow process is performed, the threshold voltage drops by an amount ΔVth of a change. Accordingly, the present disclosure prescribes an SMD mode in order to previously compensate for the amount of a change as described above.

Figure 6B:
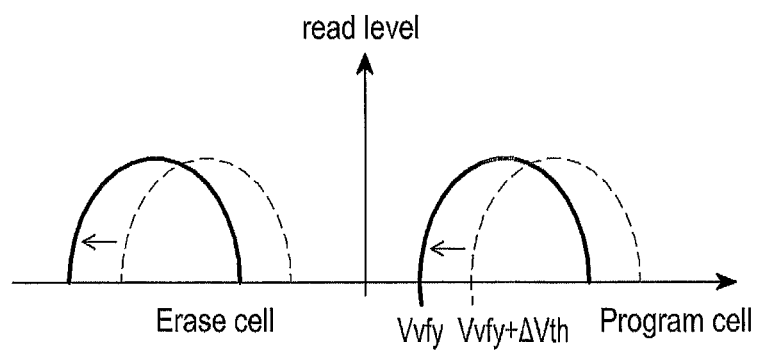

FIG. 6B shows a shift in a threshold voltage when data is first programmed by using an SMD mode and then an SMD reflow process is performed. That is, in the SMD mode, during the SMD reflow process, data is programmed by using a verify voltage (Vvfy+ΔVth) obtained by previously compensating for an amount ΔVth of a change in a threshold voltage matched to a state "0." Accordingly, when data is first programmed and then the SMD reflow process is performed, a threshold voltage drops by the amount ΔVth of the change, for which compensation has been performed, and an original threshold voltage (i.e., a threshold voltage identical to that of the user mode) appears.

Referring again to FIG. 5, in step 505, the memory device manufacturer sets the user mode to a default mode. For example, the user mode can be set to a default mode by setting a particular bit related to the user mode to 1.

Hereinabove, the process for setting a data programming mode by the memory device manufacturer according to an embodiment of the present disclosure has been described with reference to FIG. 5 and FIG. 6. Hereinafter, a method for setting a data programming mode by a host will be described with reference to the related drawings.

Figure 7:
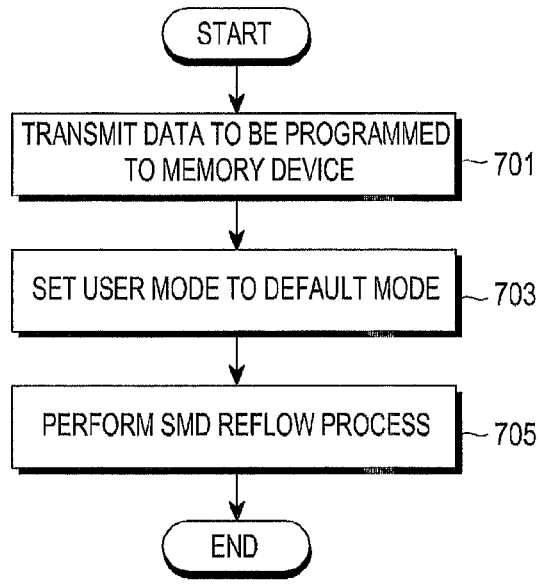
FIG. 7 is a flowchart for explaining a process for setting a data programming mode by a host according to an embodiment of the present disclosure.

FIG. 7 is a flowchart for explaining a process for setting a data programming mode by a host according to an embodiment of the present disclosure.

In step 701, the host loads data to be programmed into the memory device, and transmits the loaded data to the memory device. Accordingly, the memory device programs data by using an SMD mode. Meanwhile, as described above, the memory device manufacturer sets the user mode to a default mode, and provides the memory device which has the user mode set to a default mode, to the host. Accordingly, before the host transmits the data to be programmed, to the memory device, it needs to modify a mode from the SMD mode to a default mode. For example, a mode can be modified from the SMD mode to a default mode by setting a particular bit related to the SMD mode to 1, and by setting a particular bit related to the user mode to 0.

When the memory device finishes programming the data, the host sets the user mode to the default mode in the memory device in step 703. The reason why the memory device programs the data by using the SMD mode in step 701 is to compensate for a threshold voltage which is to be shifted during an SMD reflow process which is to be subsequently performed, as described above. Thereafter, when data is programmed by a user, the compensation for a threshold voltage as described above is not required. Accordingly, the host sets the user mode to the default mode. Whether the memory device finishes programming the data can be sensed by analyzing a control signal delivered by the memory device.

In step 705, the host performs an SMD reflow process. The order of step 703 and step 705 can be changed.

Hereinabove, the process for setting a data programming mode by the host according to an embodiment of the present disclosure has been described with reference to FIG. 7. Hereinafter, a method for programming data by a memory device will be described with reference to the related drawings.

Figure 8:
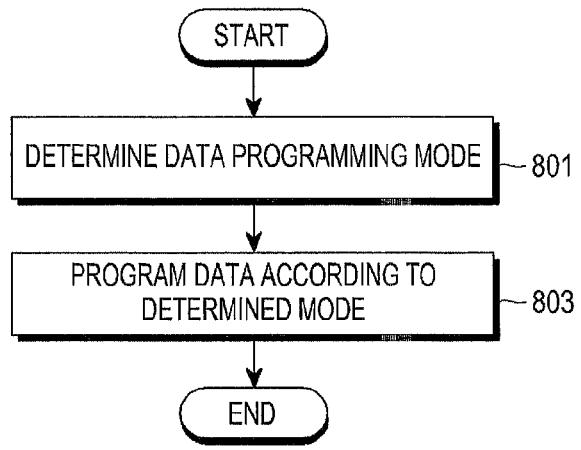
FIG. 8 is a flowchart for explaining a process for programming data in a memory device according to an embodiment of the present disclosure.

FIG. 8 is a flowchart for explaining a process for programming data in a memory device according to an embodiment of the present disclosure.

In step 801, when the host or the user instructs the memory device to program data, the memory device determines a data programming mode to be used when the memory device programs data. A programming mode can be determined by identifying a particular bit of mode information stored in a set area of the memory device. For example, the memory device can contain one or more bits indicating a programming mode, one of a user mode and an SMD mode.

When the host instructs the memory device to program data, the memory device determines the SMD mode to be used to program data. This is because, as described above, the memory device manufacturer provides the host with the memory device which has the user mode set to a default mode, however, the host can configure the SMD mode as a default mode before the memory device begins to program data.

When the user instructs the memory device to program data, the memory device determines the user mode to be used to program data. This is because, as described above, the host provides the user with an electronic device including the memory device, which has the user mode set to a default mode.

In step 803, the memory device programs data according to the determined data programming mode. Namely, the memory device programs data by using a verify voltage prescribed by the determined data programming mode.

For example, when the memory device programs data by using the SMD mode, it programs the data based on a verify voltage prescribed by the SMD mode. Namely, the memory device programs the data by using a verify voltage obtained by compensating for the amount of a change in a threshold voltage, which is to occur during an SMD reflow process. When the memory device programs data by using the user mode, it programs the data based on a threshold voltage prescribed by the user mode.

Hereinabove, the methods for programming data according to exemplary embodiments of the present disclosure have been described. Hereinafter, apparatuses according to exemplary embodiments of the present disclosure will be described with reference to the related drawings.

First, an apparatus for setting a data programming mode of a memory device manufacturer according to an embodiment of the present disclosure will be described with reference to FIG. 9.

Figure 9:
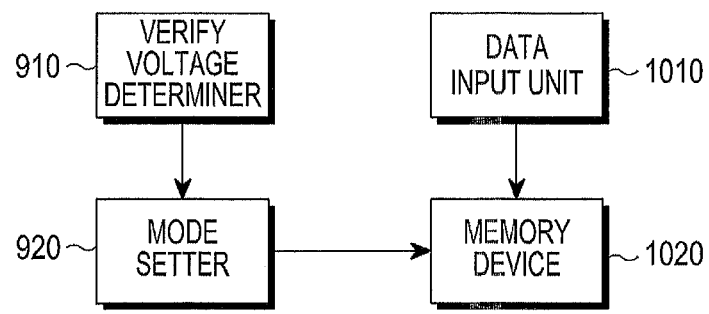
FIG. 9 is a high-level block diagram for explaining an apparatus for setting a data programming mode of a memory device manufacturer according to an embodiment of the present disclosure.

Referring to FIG. 9, an apparatus for setting a data programming mode of a memory device manufacturer according to an embodiment of the present disclosure includes a verify voltage determiner 910 and a mode setter 920.

The verify voltage determiner 910 measures a shift in distribution which is to occur during an SMD reflow process, i.e., the amount of a change in a threshold voltage of each cell. The amount of a change can be measured based on time and temperature conditions during the SMD reflow process, which are provided by the host. That is, after data is first programmed into an optional memory device and then the relevant memory device is exposed under the time and temperature conditions which have been provided by the host, a shift in distribution can be measured, and thereby the amount of a change can be measured. According to an exemplary embodiment, the amount of a change can be provided by the host. In this case, the verify voltage determiner 910 can avoid the measurement of the amount of a change.

Then, the verify voltage determiner 910 compensates for the measured amount of the change, and determines a verify voltage which is to be used in an SMD mode.

The mode setter 920 sets an SMD mode and a user mode which are to be used to program data, and stores information related to the set mode in the memory device. Then, the mode setter 920 sets the user mode to a default mode. A mode can be set to a default mode, for example, by setting a particular bit related to the relevant mode to 1.

Hereinabove, the apparatus for setting a data programming mode of the memory device manufacturer according to an embodiment of the present disclosure has been described. Hereinafter, an apparatus for setting a data programming mode of a host will be described with reference to the related drawings.

Referring again to FIG. 9, the data input unit 1010 loads an operating system, applications and various data which are to be programmed into a memory device 1020, and transmits the loaded data to the memory device 1020. To this end, the data input unit 1010 can include an I/O interface for communicating with the memory device 1020.

The mode setter 920 sets a default mode to an SMD mode in the memory device before data is programmed, i.e., before data is transmitted from the data input unit 1010 to the memory device 1020. Then, when the memory device finishes programming the data, the mode setter 920 sets the default mode to a user mode in the memory device.

Hereinabove, the apparatus for setting a data programming mode of the host according to an embodiment of the present disclosure has been described with reference to FIG. 9. Hereinafter, a memory device according to an embodiment of the present disclosure will be described with reference to the related drawings.

Figure 10:
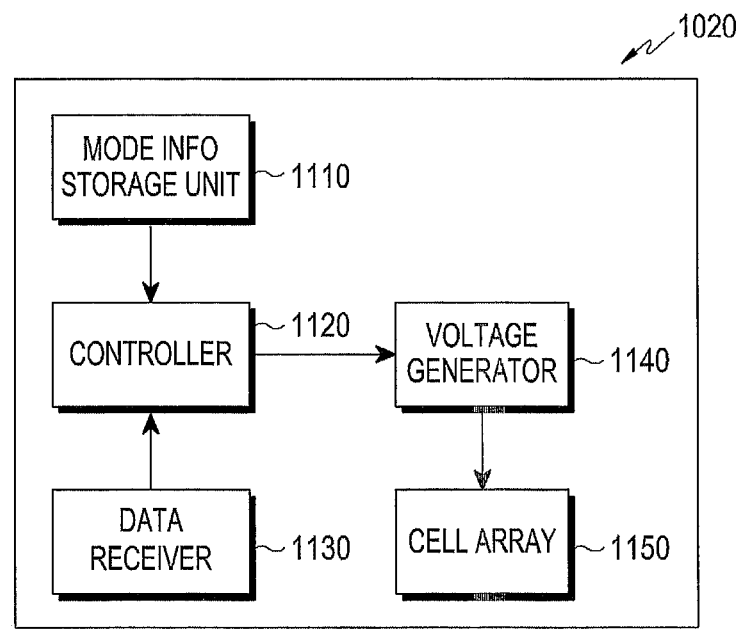
FIG. 10 is a high-level block diagram for explaining a memory device according to an embodiment of the present disclosure.

FIG. 10 is a high-level block diagram for explaining a memory device according to an embodiment of the present disclosure.

Referring to FIG. 10, a memory device according to an embodiment of the present disclosure includes a mode information storage unit 1110, a controller 1120, a data receiver 1130, a voltage generator 1140, and a cell array 1150.

The mode information storage unit 1110 stores information related to data programming modes to be used to program data. The information related to data programming modes includes information on which programming mode is a relevant data programming mode, and information on whether a verify voltage in the relevant mode and the relevant mode are a default verify voltage and a default mode.

The controller 1120 determines a data programming mode to be used to program data. A data programming mode can be determined by identifying information stored in the mode information storage unit 1110. For example, the controller 1120 can identify a particular one or set bits, and can determine a mode which is set to a default mode among multiple data programming modes as a data programming mode to be used to program data. As described above, a change of a default mode is required when data is programmed by the host. Accordingly, after a change of a default mode is performed and data is delivered from the data receiver 1130, the controller 1120 can determine a data programming mode which is to be used to program data.

Then, the controller 1120 generates a control signal based on a verify voltage to be used in the determined data programming mode and data received from the data receiver 1130, and delivers the generated control signal to the voltage generator 1140.

The data receiver 1130 receives data as input from a host device or a user device, and delivers the received data to the controller 1120.

The voltage generator 1140 programs data into cells forming the cell array 1150 according to the control signal delivered by the controller 1120.

The cell array 1150 includes multiple memory cells. In the cell array 1150, a process in which electrons are trapped in the floating gate according to a voltage applied by the voltage generator 1140 occurs, and a process for programming data into each cell is performed until a verify voltage in a relevant mode is satisfied.

The embodiments of the present disclosure as described above can be implemented by various optional methods. For example, the embodiments of the present disclosure may be implemented in hardware, in software, or in a combination of hardware and software. When the embodiments of the present disclosure are implemented in software, the embodiments of the present disclosure may be implemented in software executed by one or more processors using various operating systems or various platforms. In addition, this software may be written by using an optional programming language among multiple appropriate programming languages. Also, this software may be compiled into an executable machine language code or intermediate code, which is executed by a framework or a virtual machine.

Also, when the embodiments of the present disclosure are executed by one or more processors, the embodiments of the present disclosure may be implemented by using processor-readable mediums (for example, a memory, a floppy disk, a compact disk, an optical disk, and a magnetic tape) for recording one or more programs for performing the methods which implement the various embodiments of the present disclosure as discussed above.

The present disclosure has an advantage in that the loss of programmed data does not occur even after going through an SMD reflow process.

Although the present disclosure has been described with an exemplary embodiment, various changes and modifications may be suggested to one skilled in the art. It is intended that the present disclosure encompass such changes and modifications as fall within the scope of the appended claims.

What is claimed is:

1. A method to program data in a non-volatile memory device, the method comprising:
   determining a programming mode to be used to program data among at least two programming modes that prescribe different verify voltages for cells to be programmed based on set mode information; and
   programming data into the cells according to the determined programming mode, wherein the at least two programming modes comprise a first programming mode with a first verify voltage and a second programming mode with a second verify voltage that is greater than the first verify voltage by a set value, and wherein the set value is acquired by measuring an amount of variation in a threshold voltage after processing a surface mount device reflow.

2. The method as claimed in claim 1, wherein the variation amount corresponds to an amount of variation in a threshold voltage of the cells to be programmed under set time and set temperature conditions.

3. The method as claimed in claim 1, wherein the mode information comprises:
   information used to determine a programming mode; and
   verify voltages matched to each programming mode.

4. A method to set a data programming mode for a non-volatile memory device, the method comprising:
setting at least two programming modes that prescribe different verify voltages for cells to be programmed; and
storing mode information on each of the at least two set programming modes in the non-volatile memory device, wherein the at least two programming modes comprise a first programming mode with a first verify voltage and a second programming mode with a second verify voltage that is greater than the first verify voltage by a set value, and wherein the set value is acquired by measuring an amount of variation in a threshold voltage after processing a surface mount device reflow.

5. The method as claimed in claim 4, wherein the variation amount corresponds to an amount of variation in a threshold voltage of the cells to be programmed under set time and set temperature conditions.

6. The method as claimed in claim 4, wherein the mode information comprises:
information used to determine a programming mode; and
verify voltages matched to each programming mode.

7. An apparatus to program data in a non-volatile memory device, the apparatus comprising:
a controller configured to:
determine a programming mode to be used to program data among at least two programming modes that prescribe different verify voltages for cells to be programmed based on set mode information, and
generate a control signal according to the determined programming mode; and
a voltage generator configured to apply a programming voltage to at least one cell based on the control signal received from the controller, wherein the at least two programming modes comprise a first programming mode with a first verify voltage and a second programming mode with a second verify voltage that is greater than the first verify voltage by a set value, and wherein the set value is acquired by measuring an amount of variation in a threshold voltage after processing a surface mount device reflow.

8. The apparatus as claimed in claim 7, wherein the variation amount corresponds to an amount of variation in a threshold voltage of the cells to be programmed under set time and set temperature conditions.

9. The apparatus as claimed in claim 7, wherein the mode information comprises:
information used to determine a programming mode; and
a verify voltage matched to each programming mode.

10. An apparatus to set a data programming mode for a non-volatile memory device, the apparatus comprising:
a mode setter configured to:
set at least two programming modes that prescribe different verify voltages for cells to be programmed, and
store mode information on each of the at least two set programming modes in the non-volatile memory device, wherein the at least two programming modes comprise a first programming mode with a first verify voltage and a second programming mode with a second verify voltage that is greater than the first verify voltage by a set value; and
a verify voltage determiner configured to:
measure an amount of variation in a threshold voltage after processing a surface mount device flow, and
determine the second verify voltage to be obtained by compensating for the measured variation amount.

11. The apparatus as claimed in claim 10, wherein the verify voltage determiner is configured to measure the variation amount in a threshold voltage of the cells to be programmed under set time and set temperature conditions.

12. The apparatus as claimed in claim 10, wherein the mode information comprises:
information used to determine a programming mode; and
verify voltages matched to each programming mode.

13. A method to set a data programming mode for a non-volatile memory device, the method comprising:
setting a default mode to a second programming mode in the non-volatile memory device storing information of a first programming mode that prescribes a first verify voltage for cells to be programmed, the second programming mode that prescribes a second verify voltage that is greater than the first verify voltage by a set value, wherein the set value is acquired by measuring an amount of variation in a threshold voltage after processing a surface mount device reflow; and
transmitting data to the non-volatile memory device.

14. The method as claimed in claim 13, further comprising setting a default mode to the first programming mode in the non-volatile memory device when programming data using the second programming mode is completed.

15. An apparatus to set a data programming mode for a non-volatile memory device, the apparatus comprising:
a mode setter configured to set a default mode to a second programming mode in the non-volatile memory device storing information on a first programming mode that prescribes a first verify voltage for cells to be programmed, the second programming mode that prescribes a second verify voltage that is greater than the first verify voltage by a set value, wherein the set value is acquired by measuring an amount of variation in a threshold voltage after processing a surface mount device reflow; and
a data input unit configured to transmit data to the non-volatile memory device.

16. The apparatus as claimed in claim 15, wherein the mode setter is configured to set a default mode to the first programming mode in the non-volatile memory device when programming data using the second programming mode is completed.

* * * * *